(12) United States Patent
Yen et al.

(10) Patent No.: US 10,236,179 B2
(45) Date of Patent: Mar. 19, 2019

(54) METHOD FOR FABRICATING SEMICONDUCTOR DEVICE

(71) Applicant: UNITED MICROELECTRONICS CORP., Hsin-Chu (TW)

(72) Inventors: Fu-Cheng Yen, Taipei (TW); Tsung-Mu Yang, Tainan (TW); Sheng-Hsu Liu, Changhua County (TW); Tsang-Hsuan Wang, Kaohsiung (TW); Chun-Liang Kuo, Kaohsiung (TW); Yu-Ming Hsu, Changhua County (TW); Chung-Min Tsai, Tainan (TW); Yi-Wei Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 81 days.

(21) Appl. No.: 15/099,581

(22) Filed: Apr. 14, 2016

(65) Prior Publication Data
US 2017/0301536 A1  Oct. 19, 2017

(51) Int. Cl.
*H01L 21/02* (2006.01)
*H01L 29/78* (2006.01)
*H01L 29/66* (2006.01)

(52) U.S. Cl.
CPC .... *H01L 21/0262* (2013.01); *H01L 21/02532* (2013.01); *H01L 21/02639* (2013.01); *H01L 29/7848* (2013.01); *H01L 21/02381* (2013.01); *H01L 21/02576* (2013.01); *H01L 29/66795* (2013.01)

(58) Field of Classification Search
CPC ..................................................... H01L 21/02
See application file for complete search history.

(56) References Cited

U.S. PATENT DOCUMENTS

| 4,728,389 A | 3/1988 | Logar |
| 5,902,088 A | 5/1999 | Fairbairn et al. |
| 2012/0043556 A1* | 2/2012 | Dube ................. H01L 21/0237 257/77 |

FOREIGN PATENT DOCUMENTS

JP   59-087813 A  *  5/1984

* cited by examiner

*Primary Examiner* — Marvin Payen
(74) *Attorney, Agent, or Firm* — Winston Hsu

(57) ABSTRACT

A method for forming an epitaxial layer on a substrate is disclosed. The method includes the steps of: providing a substrate into a chamber; injecting a precursor and a carrier gas to form the epitaxial layer on the substrate at a starting pressure; and pumping down the starting pressure to a second pressure according to a gradient during a cool down process in the chamber.

15 Claims, 4 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly to a method for fabricating an epitaxial layer on a semiconductor substrate.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as silicon germanium (SiGe) epitaxial layer in a silicon substrate. As the lattice constant of the SiGe epitaxial layer is greater than the lattice constant of the silicon substrate thereby producing stress to the channel region of PMOS transistor, the carrier mobility is increased in the channel region and speed of MOS transistor is improved accordingly. Conversely, silicon carbide (SiC) or silicon phosphide (SiP) epitaxial layer could be formed in silicon substrate to produce tensile stress for gate channel of NMOS transistor.

Nevertheless, in the case for NMOS, high pressure of dopant gas during heavy phosphorus doping often induces higher viscosity epitaxial byproduct condensing on the substrate with 3-dimensional structure. In order to prevent condensed phase consolidation to form defects and results in yield loss, actions or means has to be derived to resolve the issue effectively.

SUMMARY OF THE INVENTION

According to an embodiment of the present invention, a method for forming an epitaxial layer on a substrate is disclosed. The method includes the steps of: providing a substrate into a chamber; injecting a precursor and a carrier gas to form the epitaxial layer on the substrate at a starting pressure; and pumping down the starting pressure to a second pressure according to a gradient during a cool down process in the chamber.

According to another aspect of the present invention, a method for fabricating semiconductor device is disclosed. The method includes the steps of: providing a substrate into a chamber; injecting a precursor and a carrier gas to form an epitaxial layer on the substrate at a starting temperature; lowering the starting temperature to a second temperature; and discharging the substrate from the chamber.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
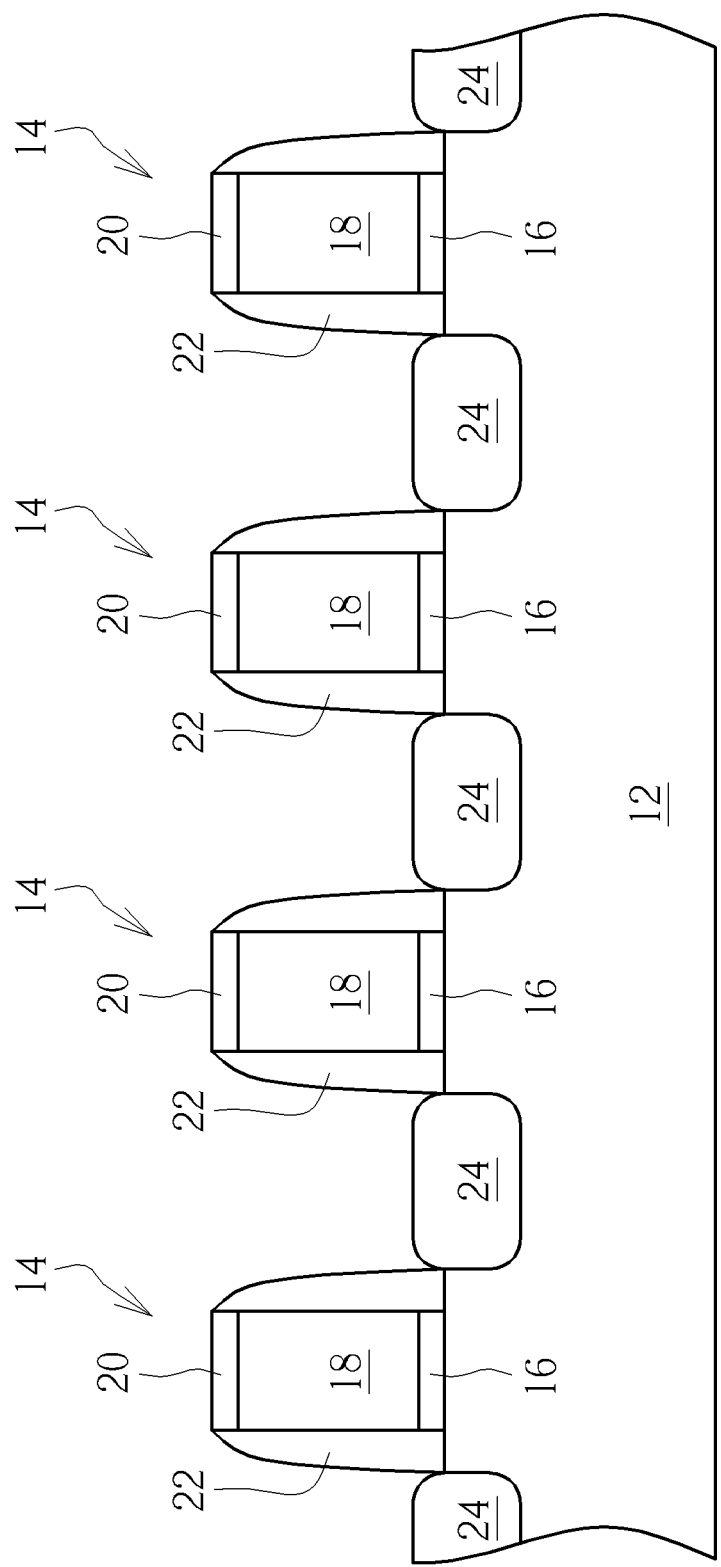
FIG. 1 illustrates a perspective view for fabricating a semiconductor device according to a preferred embodiment of the present invention.
Figure 2:
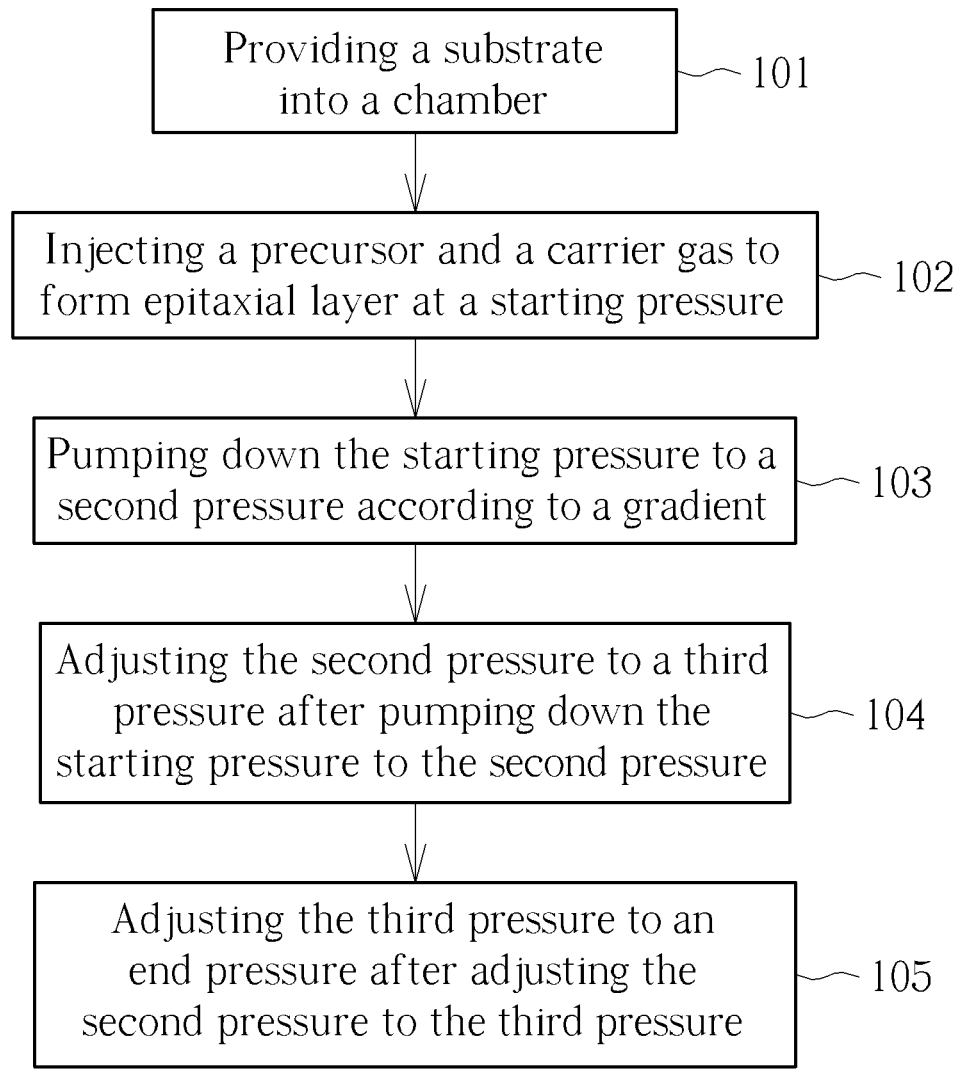
FIG. 2 is a flow chart illustrating a method for fabricating a semiconductor device according to a first embodiment of the present invention.
Figure 3:
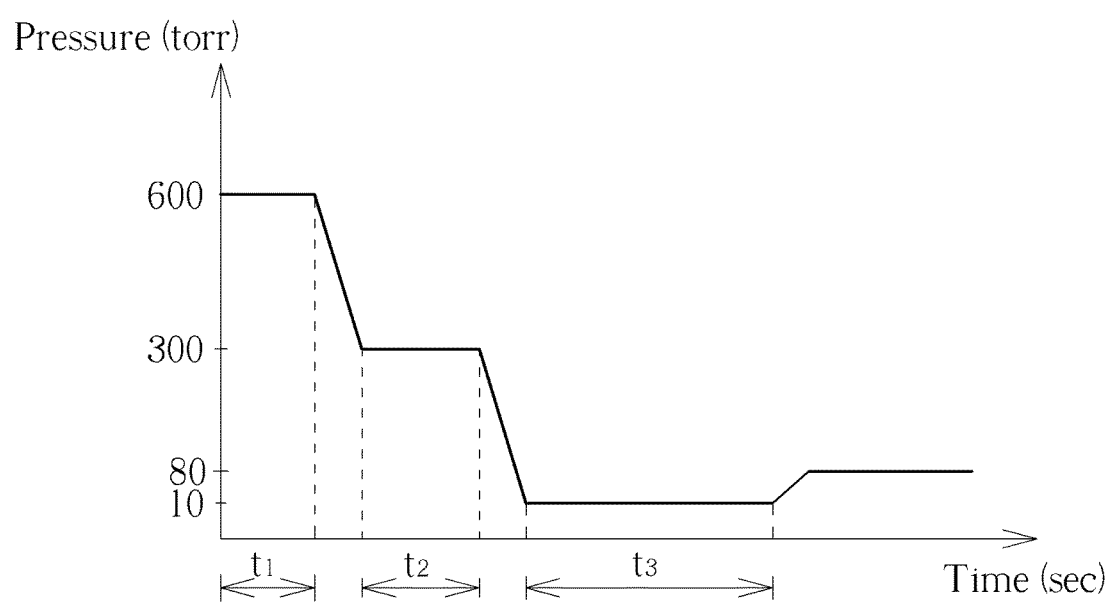
FIG. 3 is a graph illustrating a relationship between pressure change and time after the formation of epitaxial layer.

Referring to FIGS. 1-3, FIG. 1 illustrates a perspective view for fabricating a semiconductor device according to a preferred embodiment of the present invention, FIG. 2 is a flow chart illustrating a method for fabricating the semiconductor device according to a first embodiment of the present invention, and FIG. 3 is a graph illustrating a relationship between pressure change and time after epitaxial layers are formed. As shown in FIGS. 1-2, a substrate 12, such as a silicon substrate is provided. The substrate may include bulk silicon. Alternatively, an elementary semiconductor, such as a silicon or germanium in a crystalline structure, may also be included in the substrate 12. The substrate 12 may also include a compound semiconductor, such as silicon germanium, silicon carbide, gallium arsenic, gallium phosphide, indium phosphide, indium arsenide, and/or indium antimonide, or combinations thereof. Other possible substrates 12 also include a semiconductor-on-insulator substrate, such as silicon-on-insulator (SOI), SiGe-On-Insulator (SGOI), Ge-On-Insulator substrates. For example, the SOI substrates may be fabricated using separation by implantation of oxygen (SIMOX), wafer bonding, and/or other suitable methods.

Despite the present invention pertains to a planar MOS transistor, it would also be desirable to apply the process of the present invention to non-planar transistors, such as FinFET devices, and in such instance, the substrate 12 shown in FIG. 1 would become a fin-shaped structure formed atop a substrate 12.

According to an embodiment of the present invention, the fin-shaped structure would preferably be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, a plurality of gate structures 14 are formed on the substrate. In this embodiment, the formation of the gate structures 14 could be accomplished by sequentially forming a gate dielectric layer, a gate material layer, and a hard mask on the substrate 12, conducting a pattern transfer process by using a patterned resist (not shown) as mask to remove part of the hard mask, part of the gate material layer, and part of the gate dielectric layer through single or multiple etching processes, and stripping the patterned resist. This forms gate structures 14 on the substrate 12, in which each of the gate structures 14 is composed of a patterned gate dielectric layer 16, a patterned gate material layer 18, and a patterned hard mask 20. It should be noted that the quantity of the gate structures 14 is not limited to the ones disclosed in this embodiment, but could all be adjusted according to the demand of the product. Next, a spacer is formed adjacent to each of the gate structures 14, and source/drain regions (not shown) could be selectively formed in the substrate 12 adjacent to the spacers 22.

In this embodiment, the gate dielectric layer 16 could include $SiO_2$, SiN, or high-k dielectric material; the gate material layer 18 could include metal, polysilicon, or silicide; the hard mask 20 could be selected from the group consisting of $SiO_2$ and SiN; and the spacer 22 is selected from the group consisting of $SiO_2$, SiN, SiON, and SiCN.

After the gate structures 14 are formed, as shown in Step 101 in FIG. 2, the substrate 12 is introduced into a chamber. Next, recesses (not shown) could be formed in the substrate 12 adjacent to the gate structures 14 and processes including baking and cleaning are conducted to remove native oxides on the substrate 12.

Next, in Step 102, a precursor and a carrier gas are injected at a starting pressure to form buffer layer (not shown) and epitaxial layers 24 in the aforementioned recesses in the substrate 12 and adjacent to the gate structures 14. In this embodiment, the precursor injected is selected from the group consisting of $PH_3$ and $SiH_4$, the carrier gas is selected from the group consisting of $H_2$ and inert gas, and the starting pressure is preferably between 500 torr to 700 torr, and most preferably at 600 torr. This forms epitaxial layers 24 composed of silicon phosphide (SiP) in the substrate. Nevertheless, it would also be desirable to unite precursor and carrier gas of other combinations to form epitaxial layers of other material, such as epitaxial layers composed of silicon germanium (SiGe), which is also within the scope of the present invention. As shown in FIG. 3, the starting pressure is maintained for a time interval t1 before lowering to a second pressure, in which t1 in this embodiment is preferably 30 seconds.

After the epitaxial layers 24 are formed, as shown in Step 103, the starting pressure is then adjusted or pumped down to a second pressure according to a gradient. Preferably, the starting pressure is pumped down at a rate between 7 torr/sec to 17 torr/sec, and most preferably at 12 torr/sec, and the second pressure is preferably between 250 torr to 350 torr, and most preferably at 300 torr. As shown in FIG. 3, the second pressure is maintained for a time interval t2 before lowering to a third pressure, in which t2 in this embodiment is preferably 30 seconds.

Next, in Step 104, the second pressure is adjusted or pumped down to a third pressure according to a gradient, in which the second pressure is preferably higher than the third pressure. Specifically, the second pressure is pumped down at a rate between 7 torr/sec to 17 torr/sec, and most preferably at 12 torr/sec, and the third pressure is preferably between 5 torr to 20 torr, and most preferably at 10 torr. As shown in FIG. 3, the third pressure is maintained for a time interval t3 before raised to an end pressure, in which t3 in this embodiment is preferably 60 seconds.

Next, in Step 105, the third pressure is adjusted to an end pressure according to a gradient, in which the third pressure is preferably lower than the end pressure. In this embodiment, the third pressure is adjusted at a rate between 7 torr/sec to 17 torr/sec, and most preferably at 12 torr/sec, and the end pressure is preferably between 80 torr to 85 torr, and most preferably at 80 torr.

It has been observed that by pumping down or lowering the pressure after injecting precursor and carrier gas to form epitaxial layer, it would be desirable to help removing higher vapor pressure condensed phase, which might be used to consolidate and form solid phase defects on the substrate.

After the pressure is adjusted to the aforementioned end pressure, follow-up process could be carried by performing ion implants to form source/drain regions in the substrate 12 adjacent to the gate structures 14 one more time, forming a contact etch stop layer (CESL) on the substrate 12 and the gate structures 14, forming an interlayer dielectric (ILD) layer on the CESL, and optionally performing a replacement metal gate (RMG) process to transform the gate structures 14 into metal gates depending on the demand of the product.

According to an embodiment of the present invention, after injecting the precursor and the carrier gas to form the epitaxial layers 24 or after the formation of epitaxial layer 24 are completed, it would be desirable to cease the injection of the precursor while continuing injecting the carrier gas into the chamber. Specifically, the action of continuing injecting the carrier gas could further be achieved by purging the carrier gas and continuing injecting the carrier gas at the same time, and in such instance, the rate of purging the carrier gas is preferably higher than a rate of continuing injecting the carrier gas into the chamber.

Moreover, according to yet another alternative of the above embodiment, it would be desirable to not only cease the injection of the precursor while continuing injecting the carrier gas into the chamber during the formation of the epitaxial layers 24, but also cease the injection of the precursor, continue injecting the carrier gas into the chamber, and pump down the starting pressure at the same time. In other words, after the aforementioned Step 102 is completed, it would be desirable to conduct Step 103 and ceasing the injection of the precursor while continuing injecting the carrier gas at the same time. Similarly, the action of continuing injecting the carrier gas could further be achieved by purging the carrier gas and continuing injecting the carrier gas at the same time, and in such instance, the rate of purging the carrier gas is preferably higher than a rate of continuing injecting the carrier gas into the chamber.

Figure 4:
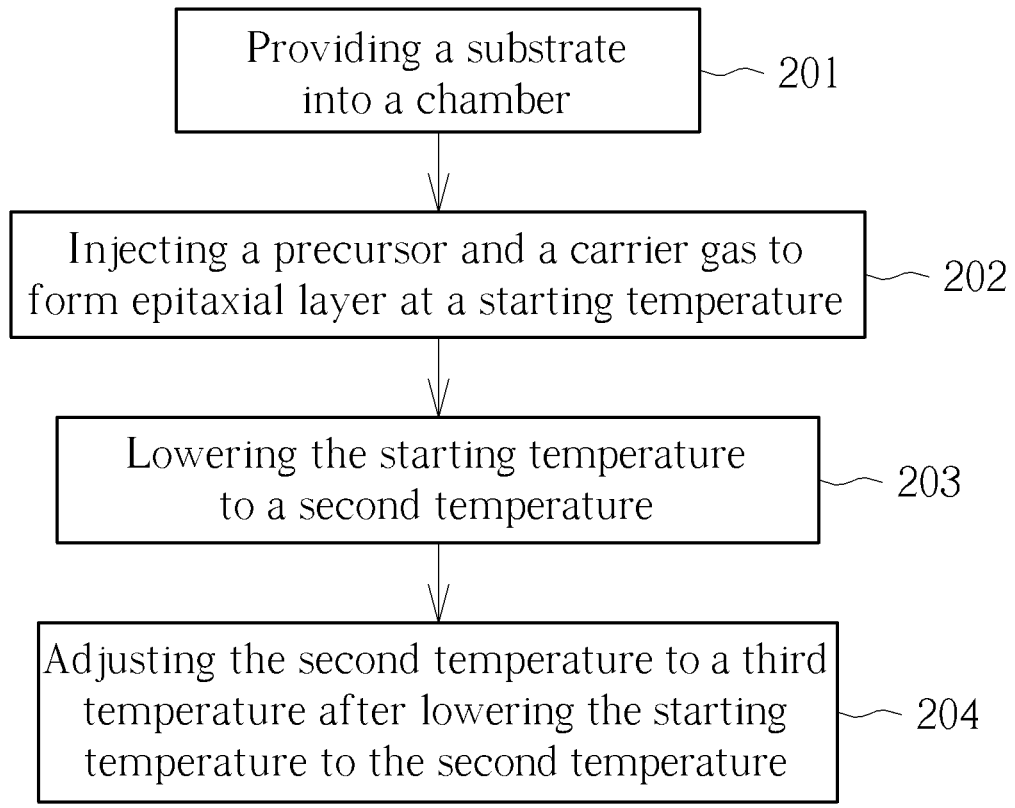
FIG. 4 is a flow chart illustrating a method for fabricating a semiconductor device according to a second embodiment of the present invention.

Referring to FIG. 1 and FIG. 4, in which FIG. 4 is a flow chart illustrating a method for fabricating semiconductor device according to a second embodiment of the present invention. As shown in FIG. 1, a substrate 12, such as a silicon substrate is first provided, a plurality of gate structures 14 are formed on the substrate 12, and spacers 22 are formed adjacent to the gate structures 14. The formation of the gate structures 14 and the spacers 22 could be accomplished by process disclosed in the aforementioned embodiment, and the details of which are not explained herein for the sake of brevity.

After the gate structures 14 are formed, as shown in Step 201 in FIG. 4, the substrate 12 is introduced into a chamber. Next, in Step 202, a precursor and a carrier gas are injected at a starting temperature to form epitaxial layers 24 in the substrate 12 and adjacent to the gate structures 14. In this embodiment, the precursor injected is selected from the group consisting of $PH_3$ and $SiH_4$ the carrier gas is selected from the group consisting of $H_2$ and inert gas, and the starting temperature is preferably between 650° C. to 700° C., and most preferably at 670° C. This forms epitaxial layers composed of silicon phosphide (SiP) in the substrate. Nevertheless, it would also be desirable to unite precursor and carrier gas of other combinations to form epitaxial layers of other material, such as epitaxial layers composed of silicon germanium (SiGe), which is also within the scope of the present invention.

Next, in Step 203, the starting temperature is adjusted or lowered to a second temperature according to a gradient. Preferably, the second temperature is between 300° C. to 380° C., and most preferably at 350° C.

Next, in Step 204, the second temperature is adjusted to a third temperature or an end temperature according to a gradient, in which the second temperature is preferably higher than the end temperature. In this embodiment the end temperature is preferably between 15° C. to 30° C., and most preferably at room temperature.

It has been observed that by introducing a cool down process or lowering the temperature after injecting precursor and carrier gas for forming epitaxial layer, it would be desirable to efficiently remove residue gases due to lower viscosity.

After the temperature is adjusted to the aforementioned end temperature, follow-up process could be carried by performing ion implants to form source/drain regions in the substrate 12 adjacent to the gate structures 14 one more time, forming a contact etch stop layer (CESL) on the substrate 12 and the gate structures 14, forming an interlayer dielectric (ILD) layer on the CESL, and optionally performing a replacement metal gate (RMG) process to transform the gate structures 14 into metal gates depending on the demand of the product.

According to an embodiment of the present invention, the approach of ceasing the injection of precursor while continuing injecting the carrier gas as disclosed in the aforementioned embodiment could also be conducted along with the adjustment in temperature. For instance, it would be desirable to not only cease the injection of the precursor while continuing injecting the carrier gas into the chamber during the formation of the epitaxial layers 24, but also cease the injection of the precursor, continuing injecting the carrier gas into the chamber, and lowering the starting temperature at the same time. In other words, after the aforementioned Step 202 is completed, it would be desirable to conduct Step 203 and ceasing the injection of the precursor while continuing injecting the carrier gas at the same time. Similarly, the action of continuing injecting the carrier gas could be further achieved by purging the carrier gas and continuing injecting the carrier gas at the same time, and in such instance, the rate of purging the carrier gas is preferably higher than a rate of continuing injecting the carrier gas into the chamber.

Moreover, it should be noted that despite the aforementioned temperature alteration or adjustment is preferably conducted without the adjustment of other parameters, the alteration or lowering of the temperature disclosed in the aforementioned second embodiment could be employed in conjunction with the pressure change conducted in the aforementioned first embodiment.

For instance, after the substrate 12 is introduced into a chamber as in Steps 101 and 201, a precursor and a carrier gas are injected at a starting pressure and a starting temperature to form epitaxial layers 24 in the substrate 12 and adjacent to the gate structures 14 as disclosed in Steps 102 and 202. Preferably, the starting pressure is between 500 torr to 700 torr, and most preferably at 600 torr and the starting temperature is preferably between 650° C. to 700° C., and most preferably at 670° C.

Next, in Steps 103 and 203, the starting pressure is adjusted or pumped down to a second pressure according to a gradient while the starting temperature is also adjusted to a second temperature. Preferably, the starting pressure is pumped down at a rate between 7 torr/sec to 17 torr/sec, and most preferably at 12 torr/sec, the second pressure is preferably between 250 torr to 350 torr, and most preferably at 300 torr, and the second temperature is between 300° C. to 380° C., and most preferably at 350° C.

Next, in Steps 104 and 204, the second pressure is adjusted or pumped down to a third pressure according to a gradient while the second temperature is adjusted to a third temperature or end temperature, in which the second pressure is preferably higher than the third pressure and the second temperature is higher than the third temperature. Specifically, the second pressure is pumped down at a rate between 7 torr/sec to 17 torr/sec, and most preferably at 12 torr/sec, the third pressure is preferably between 5 torr to 20 torr, and most preferably at 10 torr, and the third temperature is preferably between 15° C. to 30° C., and most preferably at room temperature.

Next, in Step 105, the third pressure is adjusted to an end pressure according to a gradient. In this embodiment, the third pressure is adjusted at a rate between 7 torr/sec to 17 torr/sec, and most preferably at 12 torr/sec, the end pressure is preferably between 80 torr to 85 torr, and most preferably at 80 torr.

According to an embodiment of the present invention, the approach of ceasing the injection of precursor while continuing injecting the carrier gas as disclosed in the aforementioned embodiment could also be conducted along with the adjustments in both pressure and temperature. For instance, it would be desirable to not only cease the injection of the precursor while continuing injecting the carrier gas into the chamber during the formation of the epitaxial layers 24, but also cease the injection of the precursor, continuing injecting the carrier gas into the chamber, pumping down the starting pressure, and lowering the temperature at the same time. In other words, after the aforementioned Steps 102 and 202 are completed, it would be desirable to conduct both Steps 103 and 203 and ceasing the injection of the precursor while continuing injecting the carrier gas at the same time. Similarly, the action of continuing injecting the carrier gas could further be achieved by purging the carrier gas and continuing injecting the carrier gas at the same time, and in such instance, the rate of purging the carrier gas is preferably higher than a rate of continuing injecting the carrier gas into the chamber.

Overall, the present invention provides following advantages:

1. By purging carrier gas before pumping down pressure or lowering temperature during epitaxial formation, it would be desirable to dilute and decrease amount of un-reacted gas and epitaxial layer byproducts insides the chamber and reduce the viscosity of residue gas for efficient removal.
2. By pumping down pressure with or without during a cool down process in the chamber, it would be desirable to help removing higher vapor pressure condensed phase, which might consolidate and form solid phase or defects on the substrate.

3. By introducing a cool down process or lowing temperature during the pressure pump-down process, it would be desirable to efficiently remove residue gases due to lower viscosity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming an epitaxial layer on a substrate, comprising:
   providing the substrate into a chamber;
   injecting a precursor and a carrier gas to form the epitaxial layer on the substrate at a starting pressure;
   pumping down the starting pressure between 7 torr/sec to 17 torr/sec to a second pressure according to a gradient during a cool down process in the chamber; and
   ceasing the injection of the precursor while continuing injecting the carrier gas into the chamber, and pumping down the starting pressure at the same time.

2. The method of claim 1, wherein the precursor comprises $PH_3$ and $SiH_4$.

3. The method of claim 1, wherein the carrier gas is selected from the group consisting of $H_2$ and inert gas.

4. The method of claim 1, further comprising adjusting the second pressure to a third pressure after pumping down the starting pressure to the second pressure.

5. The method of claim 4, wherein the second pressure is higher than the third pressure.

6. The method of claim 4, further comprising adjusting the third pressure to an end pressure after adjusting the second pressure to the third pressure.

7. The method of claim 6, wherein the third pressure is lower than the end pressure.

8. The method of claim 1, further comprising purging the carrier gas and continuing injecting the carrier gas at the same time.

9. The method of claim 8, wherein a rate of purging the carrier gas is higher than a rate of continuing injecting the carrier gas.

10. The method of claim 1, wherein the epitaxial layer is formed on the substrate at a starting temperature, the method comprising:
    lowering the starting temperature while pumping down the starting pressure.

11. A method for fabricating a semiconductor device, comprising:
    providing a substrate into a chamber;
    injecting a precursor and a carrier gas to form an epitaxial layer on the substrate at a starting temperature and a starting pressure;
    pumping down the starting pressure between 7 torr/sec to 17 torr/sec to a second pressure according to a gradient during a cool down process in the chamber, wherein ceasing the injection of the precursor while continuing injecting the carrier gas into the chamber, and pumping down the starting pressure at the same time;
    lowering the starting temperature to a second temperature; and
    discharging the substrate from the chamber.

12. The method of claim 11, wherein the precursor comprises $PH_3$ and $SiH_4$.

13. The method of claim 11, wherein the carrier gas is selected from the group consisting of $H_2$ and inert gas.

14. The method of claim 11, further comprising adjusting the second temperature to a third temperature after lowering the starting temperature to the second temperature.

15. The method of claim 14, wherein the second temperature is higher than the starting temperature.

* * * * *